(12) United States Patent
Yuan et al.

(10) Patent No.: US 12,205,804 B2
(45) Date of Patent: Jan. 21, 2025

(54) SILICON SPUTTERING TARGET WITH SPECIAL SURFACE TREATMENT AND GOOD PARTICLE PERFORMANCE AND METHODS OF MAKING THE SAME

(71) Applicant: Tosoh SMD, Inc., Grove City, OH (US)

(72) Inventors: Yongwen Yuan, Dublin, OH (US); Eugene Y. Ivanov, Grove City, OH (US); Yang Liu, Dublin, OH (US); Phil Frausto, Columbus, OH (US); Weifang Miao, Columbus, OH (US)

(73) Assignee: TOSOH SMD, INC., Grove City, OH (US)

( * ) Notice: Subject to any disclaimer, the term of this patent is extended or adjusted under 35 U.S.C. 154(b) by 0 days.

(21) Appl. No.: 15/362,986

(22) Filed: Nov. 29, 2016

(65) Prior Publication Data

US 2017/0076923 A1 Mar. 16, 2017

Related U.S. Application Data

(62) Division of application No. 14/355,080, filed as application No. PCT/US2012/063829 on Nov. 7, 2012, now Pat. No. 9,566,618.

(Continued)

(51) Int. Cl.
*C23C 14/34* (2006.01)
*B08B 3/04* (2006.01)
(Continued)

(52) U.S. Cl.
CPC ............ *H01J 37/3426* (2013.01); *B08B 3/04* (2013.01); *B08B 3/08* (2013.01); *C23C 14/3407* (2013.01);
(Continued)

(58) Field of Classification Search
CPC ......... B08B 3/04; B08B 3/08; C23C 14/3407; C23C 14/3426; C23C 14/3435;
(Continued)

(56) References Cited

U.S. PATENT DOCUMENTS 4,948,482 A * 8/1990 Kobayashi .......... C23C 14/0652
204/192.23
4,978,437 A 12/1990 Wirz
(Continued)

FOREIGN PATENT DOCUMENTS

CN 101595239 A 12/2009
EP 0 941 841 A2 3/1999
(Continued)

OTHER PUBLICATIONS

Machine Translation Of 2003-077529 (Year: 2003).*
(Continued)

*Primary Examiner* — Rodney G McDonald
(74) *Attorney, Agent, or Firm* — McDonald Hopkins LLC

(57) ABSTRACT

A sputter target assembly comprising a Si target and a backing plate is provided wherein the backing plate is bonded to the target. The Si target comprises a smooth, mirror-like surface and has a surface roughness of less than about 15.0 Angstroms. Methods are provided for producing silicon target/backing plate assemblies wherein a silicon blank is processed to remove scratches from the blank surface resulting in a mirror like surface on the target, and a surface roughness of 15.0 Angstroms or less. The method comprises a first and second cleaning step with the first step being performed before the scratch removal step, and the second step being performed after the scratch removal.

13 Claims, 8 Drawing Sheets

Related U.S. Application Data

(60) Provisional application No. 61/556,926, filed on Nov. 8, 2011.

(51) Int. Cl.
*B08B 3/08* (2006.01)
*H01J 37/34* (2006.01)
*C23C 14/06* (2006.01)
*C23C 14/16* (2006.01)

(52) U.S. Cl.
CPC ...... *H01J 37/3435* (2013.01); *C23C 14/0652* (2013.01); *C23C 14/165* (2013.01); *C23C 14/3414* (2013.01)

(58) Field of Classification Search
CPC .............. C23C 14/0652; C23C 14/165; C23C 14/3414; H01J 37/3426; H01J 37/3435
USPC ............. 204/298.12, 298.13, 192.23, 192.25
See application file for complete search history.

(56) References Cited

U.S. PATENT DOCUMENTS

| | | | |
|---|---|---|---|
| 5,230,459 A | 7/1993 | Mueller et al. | |
| 5,403,458 A | 4/1995 | Hartig et al. | |
| 5,415,756 A | 5/1995 | Wolfe et al. | |
| 5,464,520 A | 11/1995 | Kano et al. | |
| 5,618,397 A | 4/1997 | Kano et al. | |
| 5,639,311 A | 6/1997 | Holley et al. | |
| 5,744,401 A * | 4/1998 | Shirai ............... | H01L 21/02008 257/E21.212 |
| 5,836,506 A | 11/1998 | Hunt et al. | |
| 5,916,824 A * | 6/1999 | Mayuzumi ........ | H01L 21/30604 156/345.18 |
| 5,922,176 A | 7/1999 | Caskey | |
| 5,965,278 A | 10/1999 | Finley et al. | |
| 6,024,852 A * | 2/2000 | Tamura ................ | C22C 14/00 148/421 |
| 6,030,514 A | 2/2000 | Dunlop et al. | |
| 6,113,985 A | 9/2000 | Suscavage et al. | |
| 6,283,357 B1 | 9/2001 | Kulkarni et al. | |
| 6,284,111 B1 | 9/2001 | Takahashi et al. | |
| 6,342,134 B1 | 1/2002 | Barber et al. | |
| 6,394,888 B1 | 5/2002 | Matsumoto et al. | |
| 6,406,540 B1 | 6/2002 | Harris et al. | |
| 6,423,586 B1 * | 7/2002 | Yamazaki ......... | H01L 21/02532 438/166 |
| 6,464,847 B1 | 10/2002 | Kumahara et al. | |
| 6,620,031 B2 | 9/2003 | Renteln | |
| 6,682,636 B2 | 1/2004 | Mohan et al. | |
| 6,774,009 B1 | 8/2004 | Johnson et al. | |
| 6,787,864 B2 | 9/2004 | Paton et al. | |
| 6,849,139 B2 | 2/2005 | Kardokus et al. | |
| 6,878,640 B2 | 4/2005 | Voutsas et al. | |
| 6,998,070 B2 | 2/2006 | Inoue et al. | |
| 7,393,600 B2 | 7/2008 | Inoue et al. | |
| 7,504,008 B2 | 3/2009 | Doan et al. | |
| 7,630,227 B2 | 12/2009 | Tran | |
| 7,638,200 B2 | 12/2009 | Smathers et al. | |
| 7,803,703 B2 | 9/2010 | Yue et al. | |
| 7,897,068 B2 | 3/2011 | Hosono et al. | |
| 7,909,949 B2 | 3/2011 | Nakamura et al. | |
| 7,951,275 B2 | 5/2011 | Tsukamoto | |
| 8,227,394 B2 | 7/2012 | Zhu et al. | |
| 8,338,002 B2 | 12/2012 | Hommura et al. | |
| 8,426,242 B2 | 4/2013 | Cheng et al. | |
| 8,551,267 B2 | 10/2013 | Miao et al. | |
| 8,623,511 B2 | 1/2014 | Kawashima et al. | |
| 8,663,736 B2 | 3/2014 | Jung et al. | |
| 8,702,919 B2 | 4/2014 | Ferrasse et al. | |
| 8,728,287 B2 | 5/2014 | Martin et al. | |
| 8,784,700 B2 | 7/2014 | Inoue et al. | |
| 9,005,489 B2 | 4/2015 | Uchiyama et al. | |
| 2002/0171123 A1 | 11/2002 | Voutsas et al. | |
| 2004/0040837 A1 | 3/2004 | McTeer et al. | |
| 2007/0215463 A1 | 9/2007 | Parkhe | |
| 2009/0045044 A1 | 2/2009 | Akins et al. | |
| 2009/0107834 A1 | 4/2009 | Ye et al. | |
| 2010/0016202 A1 | 1/2010 | Mui et al. | |
| 2011/0036710 A1 | 2/2011 | Takami et al. | |
| 2011/0048935 A1 | 3/2011 | Koide | |
| 2011/0104904 A1 * | 5/2011 | Nishimura ........ | H01L 21/02052 438/745 |
| 2011/0132757 A1 | 6/2011 | Nakamura et al. | |
| 2011/0162971 A1 | 7/2011 | Nakamura et al. | |
| 2011/0245127 A1 | 10/2011 | Suzuki et al. | |
| 2014/0001469 A1 | 1/2014 | Park et al. | |
| 2014/0224646 A1 | 8/2014 | Li et al. | |

FOREIGN PATENT DOCUMENTS

| | | |
|---|---|---|
| EP | 1 591 555 A1 | 11/2005 |
| EP | 1 573 081 A3 | 12/2005 |
| EP | 1 475 795 B1 | 10/2012 |
| JP | 1991-261697 A | 11/1991 |
| JP | H-03-261697 A | 11/1991 |
| JP | 05-036142 * | 2/1993 |
| JP | 1994-053137 A | 2/1994 |
| JP | H-06-053137 A | 2/1994 |
| JP | 1994-346215 A | 12/1994 |
| JP | H 06346215 A | 12/1994 |
| JP | 1995-048667 A | 2/1995 |
| JP | 10748667 A | 2/1995 |
| JP | 1995-126837 A | 5/1995 |
| JP | H-07-126837 A | 5/1995 |
| JP | 1995-235534 A | 9/1995 |
| JP | H07235534 A | 9/1995 |
| JP | H 3536618 B2 | 4/1999 |
| JP | H 11 181 494 A | 7/1999 |
| JP | 2000-021862 A | 1/2000 |
| JP | 2001-031494 * | 2/2001 |
| JP | 2001-059170 A | 3/2001 |
| JP | 2001-164361 A | 6/2001 |
| JP | 3226193 A | 11/2001 |
| JP | 3292101 B2 | 6/2002 |
| JP | 2003 051 449 A | 2/2003 |
| JP | 2003077529 A | 3/2003 |
| JP | 2007-534834 A | 11/2007 |
| JP | 2008-124078 A | 5/2008 |
| JP | UP 2008-124078 A | 5/2008 |
| JP | 4162211 B2 | 10/2008 |
| JP | 2010163609 A | 7/2010 |
| JP | 2011/165909 A | 8/2011 |
| WO | WO 92/17622 A1 | 10/1992 |
| WO | WO 03/102976 A1 | 12/2003 |
| WO | WO 2004/065046 A2 | 8/2004 |
| WO | WO 2010/003947 A1 | 1/2010 |
| WO | WO 2011/021691 A1 | 2/2011 |
| WO | WO 2011/046033 A1 | 4/2011 |
| WO | WO 2011/058882 A1 | 5/2011 |
| WO | WO 2011/102896 A1 | 8/2011 |
| WO | WO 2012/121028 A1 | 9/2012 |

OTHER PUBLICATIONS

Machine Translation JP 05-036142 (Year: 1993).*
Machine Translation JP 2001-031494 (Year: 2001).*
International Search Report and Written Opinion mailed Jan. 25, 2013 for PCT/US2012/063829 filed Nov. 7, 2012.
International Preliminary Examination Report mailed May 22, 2014 for PCT/US2012/063829 filed Nov. 7, 2012.
English Translation of the First Office Action, The Patent Office of the People's Republic of China, issued May 21, 2015 in CN 201280054872.5 filed Nov. 7, 2012.
English Translation of the Comments of the Examiner and the Search Report, The Patent Office of the People's Republic of China, issued May 21, 2015 in CN 201280054872.5 filed Nov. 7, 2012.
Tang et al., "Study of PVD Si Coating on SiC Ceramics for Surface Modification", Material News, Research Edition, vol. 23, No. 8, Aug. 31, 2009.

(56) References Cited

OTHER PUBLICATIONS

English Translation of the Second Office Action, The Patent Office of the People's Republic of China, issued Nov. 23, 2015 in CN 201280054872.5 filed Nov. 7, 2012.
English Translation of the Comments of the Examiner and the Search Report, The Patent Office of the People's Republic of China, issued Nov. 23, 2015 in CN 201280054872.5 filed Nov. 7, 2012.
Information Statement from JPO issued in Japanese Application No. 2014-540207 filed May 2, 2014, Feb. 25, 2016.
Information Statement issued in Japanese Patent Application No. 2014-540207 filed May 2, 2014 including List of cited published Japanese patent applications, 1 page, Feb. 25, 2016, English Translation.
Request for Issuance of Certificate of Matters Recorded in file in Japanese Patent Application No. 2014-540207 filed May 2, 2014, submitted Mar. 14, 2016.
English Translation of the Third Office Action, The Patent Office of the People's Republic of China, issued Mar. 7, 2016 in CN 201280054872.5 filed Nov. 7, 2012.
English Translation of the Comments of the Examiner, The Patent Office of the People's Republic of China, issued Mar. 7, 2016 in CN 201280054872.5 filed Nov. 7, 2012.
Wolf, Paul J., et al., "Thin Film Properties of Germanium Oxide Synthesized by Pulsed Laser Sputtering in Vacuum and Oxygen Environments", Journal of Vacuum Science & Technology, Abstract, vol. 11, 2725, 1993.
Ryu, Seung Wook, et al., SiO2 Incorporation Effects in Ge2Sb2Te5 Films Prepared by Magnetron Sputtering for Phase Change Random Access Memory Devices, Electrochemical and Solid-State Letters, vol. 9, No. 8, G259-G261, 2006.
Shrestha, Santosh, et al., "Structural Properties of Germanium Nanocrystals Deposited with RF Sputtering", Proceedings of the 50th Annual Conference, Australian Solar Energy Society (Australian Solar Council), Melbourne, Dec. 2012, six pages.
English Translation of Information Statement from JPO issued in Japanese Application No. 2014-540207 filed May 2, 2014, Feb. 25, 2016.
English Translation of The Examination Report from Taiwan Intellectual Property Office issued on Apr. 21, 2016 in Taiwanese Application No. 101141269 filed Nov. 7, 2012.
Tang, H., et al., "Study of PVD Si Coating on SiC Ceramics for Surface Modification", Materials Review: Research, Aug. 2009, vol. 23, No. 8, Section 1.1.
English Translation of the Decision of the Intellectual Property Office Reasons for Rejection issued in Taiwan Patent Application No. 110141269 issued Apr. 26, 2016.
Notification of Reasons for Refusal issued Jun. 19, 2018 in Japanese Patent Application No. 2017-181756.
English Translation of Notification of Reasons for Refusal issued Jun. 19, 2018 in Japanese Patent Application No. 2017-181756.
Decision of Refusal and Translation issued in Japanese Patent Application No. 2014-540207 issued Jun. 27, 2017.
Abstract of Decision of Refusal issued in Japanese Patent Application No. 2014-540207 issued Jun. 27, 2017.
Notification of Refusal in related JP Pat. App. No. 2014-540207, issued Aug. 2, 2016.
Examination Report issued in related TW Pat. App. No. 101141269, issued Apr. 26, 2016.

* cited by examiner

SILICON SPUTTERING TARGET WITH SPECIAL SURFACE TREATMENT AND GOOD PARTICLE PERFORMANCE AND METHODS OF MAKING THE SAME

CROSS REFERENCE TO RELATED APPLICATIONS

This application claims the priority benefit of U.S. Provisional Patent Application Ser. No. 61/556,926 filed Nov. 8, 2011; International Application No. PCT/US2012/063829 filed Nov. 7, 2012; and U.S. patent application Ser. No. 14/355,080 filed Apr. 29, 2014.

FIELD OF INVENTION

The invention relates to a silicon sputtering target bonded to a backing plate consisting of Mo, Ti, Zr, Ta, Hf, Nb, W, Cu and the alloys of these elements or Mo/Cu, Ti/Al composite backing plates, and to a method of producing such a target. One aspect of the invention relates to a silicon-backing plate sputtering target assembly with a special surface treatment.

BACKGROUND OF THE INVENTION

Silicon (Si) is one of most common elements in the universe by mass and it most exists in compound forms of sands, dusts, silicon dioxide (silica), or silicates, etc. Pure crystal silicon is a gray color and brittle in nature. Silicon has atomic number 14, an atomic weight of 28.09, and a density of 2.33 g/cm$^3$. Silicon has a diamond cubic crystal structure at room temperature, a melting point of 1310° C., a boiling point of 2357° C. Furthermore, silicon has a linear coefficient of thermal expansion (CTE) of 2.49 μm/m–° C. at temperature 25.0° C.

Silicon is a semiconductor and plays a key role in the modern world economy. In fact, the entire modern semiconductor microelectronics industry is established on silicon base. Silicon is widely used for integrated circuits, chips, logic electronics devices, and memory electronics devices. Silicon and its compounds are not only used for forming the substrate where the semiconductor chips are built on but also for the function units or layer for transistors and stacking structures such as silicon electrode, silicon dioxide dielectric layers, and silicon nitride mask layers, inside the chips and integrated circuits (IC).

In recent years, high-k metal gate (HKMG) transistor technology has been developed and applied to 45 nm and below to manufacture IC devices for a wide variety of high performance and low power applications such as graphics, networking, and wireless mobile applications. One of the key tasks for high-k metal gate (HKMG) is to find out suitable new metal materials and reliable film formation methods to control of the channel with high on currents and low leakage current and keep the integrity of complex structures. Hf, TiAl, TiN, TiAlN, TiSiN, TaAlN, TaSiN, and rare earth metals are reported to be used as metal gate materials. Recently, much attention has been paid to utilize silicon to as metal gate structure materials due to its unique chemical and physical properties and natural connection to the semiconductor technologies built on the silicon.

Silicon and silicon nitride layers beyond the substrate inside the IC and chips are traditionally formed through chemical vapor deposition (CVD) method. As the microelectronics industry drives the miniaturization of devices and circuits towards nanometer dimension utilizing 45 nm and below technologies, ever-increasing stringent demands have been placed on the precision and minimum impact device integrity of film/structure formation methods. Sputtering is a mechanism by which atoms are removed from the surface of a material (target) as a result of collision with high-energy ions through a physical vapor deposition (PVD) technique wherein atoms or molecules are ejected from a target material by high-energy ions bombardment so that the ejected atoms or atom clusters can condense on a substrate as a thin film. Sputtering has more precise control of the transportation and deposition of mass atoms and has less thermal impact on the deposited film structure than a CVD process. Si sputtering target through a PVD process is becoming more widely used to silicon layers such metal gate electrode and its compound structure layers such as silicon nitride and silicon carbides inside microelectronics integrated circuits and communication devices for a wide variety of high performance and low power applications such as graphics, networking, and wireless mobile applications.

SUMMARY OF THE INVENTION

In one embodiment, a silicon target comprises a Si target blank with a defect-free surface and molybdenum backing plate, molybdenum copper composite backing plate, or titanium aluminum composite backing plate. The target blank is bonded to backing plate through solder bonded, braze bonded, foil bonded, or other low temperature bonding methods. A surface process has been developed to achieve a nearly defect/damage-free surface for silicon sputtering target to reduce the burn-in time and particles on the films deposited from the sputtering targets. The surface process comprises the steps of machining, grinding, inspection, lapping, cleaning, surface damage removal (i.e., scratch removal), cleaning, polishing, cleaning, inspection, final cleaning, and final inspection. This invention also provides methods of manufacturing silicon sputtering targets.

BRIEF DESCRIPTION OF THE DRAWINGS

The below detailed description makes reference to the accompanying figures, in which.

DETAILED DESCRIPTION OF EXEMPLARY EMBODIMENTS

Figure 1:
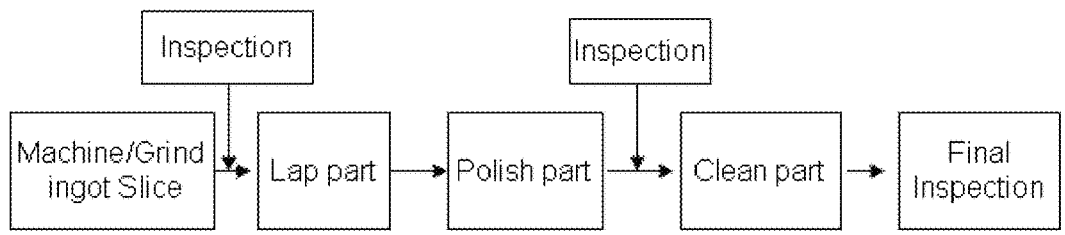
FIG. 1 is process flow chart of a comparative Si target surface process A.
Figure 2:
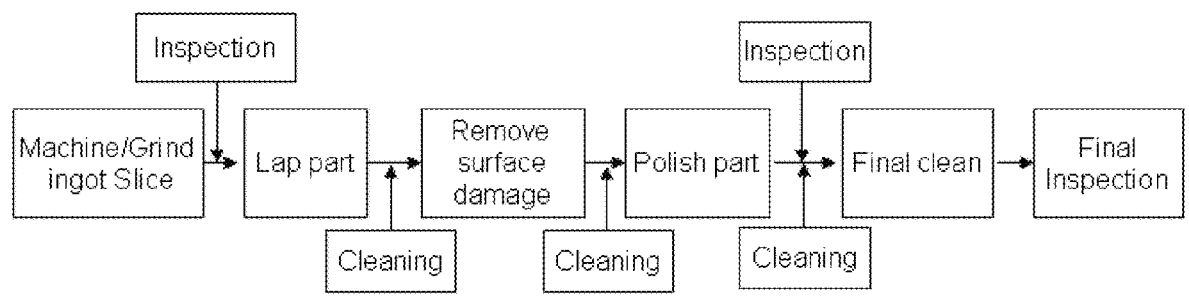
FIG. 2 is process flow chart of a Si target surface process in accordance with one embodiment of the invention, namely process B.

The silicon sputtering target encompassed by this invention can have any suitable geometry. The present invention includes a method of manufacturing the silicon target with a scratch removal surface treatment and good particle and burn-in performance. The silicon target has a purity of at least 99.999% and preferably 99.9999% excluding dopants. The silicon target blank has diameter up to 550 mm and can be intrinsic, p-type doped, or n-type doped. The silicon blank can have polycrystalline, single crystal, or semi-single crystal structure. Although other structures of Si can be used, the single crystal structure is preferable according to this patent. The silicon raw material and its dopant elements are melted to grow a silicon ingot from a molten liquid preferably through Czochralski crystal growth method or casting process. The resulting ingot can have any size and any suitable shapes including round, square, and rectangular. The silicon ingot is subsequently inspected and wire sawed into ingot slices of different desirable thicknesses for making different parts. The silicon ingot slices undergo a surface process treatment to achieve desirable dimension and surface condition. The surface process includes but is not limited to manufacturing operations such as machining, grinding, lapping, polishing, surface damage removal (i.e., scratch removal), etching, cleaning, and inspection, preferably additional cleaning steps would be applied between these any two these operations, to form a Si target blank with desirable surface conditions and characteristics and geometry dimensions. The finished Si blank is then bonded to a backing plate through solder bond or other low temperature bond methods to obtain a silicon target blank-backing plate assembly. The solder can be but not limited to indium, tin-silver, and also can use nanofoil. There are many backing plate materials options include but are not limited to Mo, Ti, Zr, Ta, Hf, Nb W, Cu and the alloys of these elements or composite backing plates like Mo/Cu and Ti/Al. The backing plate materials have a coefficient of thermal expansion (CTE) that is chosen to closely match silicon's CTE. The bonded target assemblies can have diameters of 200 mm, 300 mm, and more and can be made for target configurations with different OEM designs.

An exemplary silicon target with superfine surface has been produced according to the processes described above. Si raw material of 99.9999% or higher purity is used to grow an Si ingot, preferable dislocation-free single crystal Si ingot with a diameter from 300 mm to 800 mm, preferable diameter of greater than 450 mm by use of the Czochralski crystal growth method. The composition of the resulting ingot measured by the GDMS method is listed in the Table 1.

TABLE 1

| Impurity element | Content (ppm) | Impurity element | Content (ppm) |
| --- | --- | --- | --- |
| S | 0.092 | Ge | 0.05 |
| Li | 0.005 | As | 0.005 |
| Be | 0.005 | Rb | 0.05 |
| B | 0.019 | Zr | 0.02 |
| F | 0.05 | Mo | 0.02 |
| Na | 0.01 | Pd | 0.02 |
| Mg | 0.01 | Ag | 0.01 |
| Al | 0.07 | Cd | 0.03 |
| P | 0.01 | In | 0.02 |
| Cl | 0.48 | Sn | 0.05 |
| K | 0.025 | Sb | 0.01 |
| Ca | 0.05 | Cs | 0.005 |
| Ti | 0.002 | Ce | 0.02 |
| V | 0.002 | W | 0.02 |
| Cr | 0.01 | Pt | 0.01 |
| Mn | 0.005 | Au | 0.02 |
| Fe | 0.065 | Hg | 0.01 |
| Co | 0.005 | Tl | 0.005 |
| Ni | 0.02 | Pb | 0.02 |
| Cu | 0.051 | Th | 0.001 |
| Zn | 0.05 | U | 0.001 |
| Ga | 0.01 | C | 1.54 |
| O | 2.03 | N | 26.5 |

The weight concentration unit is ppm for all elements and total metallic impurities contents are less than 1 ppm. The ingot is sawed into ingot slices of desirable thickness. The ingot slices are subsequently subjected to process A to achieve finish surfaces and dimensions. Comparative process A as herein referred to consists of manufacturing operation steps machining, grinding, lapping, polishing, cleaning, and final inspection. Process B in accordance with one aspect of the invention consists of manufacturing operation steps machining, grinding, inspection, lapping, cleaning, surface damage removal, cleaning, polishing, cleaning, inspection, final cleaning, and final inspection. The cleaning agents include but are not limited to de-ionized water and or acids. Further cleaning agents and cleaning apparatii may be chosen from U.S. Pat. No. 8,227,394 (Zhu et al.) herein incorporated by reference. As is stated in the '394 patent, a cleaning fluid, such as a gas or liquid, can be prepared that may include a buffering agent and one or more polymers. The polymers are solubilized in the cleaning fluid and have a molecular weight of greater than about 10,000 g/mol. The polymers may, for example, be chosen from polyacrylic acid (PAA), polyacrylamide (PAM), hydroxyethyl cellulose (HEC). Copolymers of PAA and PAM are also mentioned as being exemplary. The weight percent of the polymers in the cleaning fluid may be about 0.001-10% by weight.

In addition to water, other polar solvents such as isopropyl alcohol (IPA), dimethyl sulfoxide (DMSO), and dimethyl formamide (DMF) may be mentioned. Weak acids and weak bases such as citric acid and ammonium ($NH_4OH$) can be mentioned as exemplary buffering agents.

In accordance with one aspect of process B, the scratch removal step comprises polishing to result in a substrate having an average measured roughness of 15.0 Angstroms or less.

The finished Si target blanks are bonded to backing plate through indium solder bond or low temperature bond methods to obtain a silicon target blank-backing plate assembly. There are many backing plate materials options include but are not limited to Mo, Ti, Zr, Ta, Hf, Nb, W, Cu and the alloys of these elements or Tosoh patented composite backing plates like Mo/Cu and Ti/Al. The materials have coefficient of thermal expansion (CTE) close to match silicon's CTE. The bonded target assemblies can have different 200 mm, 300 mm, and beyond target configurations with different OEM designs. In this case the backing plate material is Mo/Cu composite and the dimension is 300 mm type target.

Figure 3:
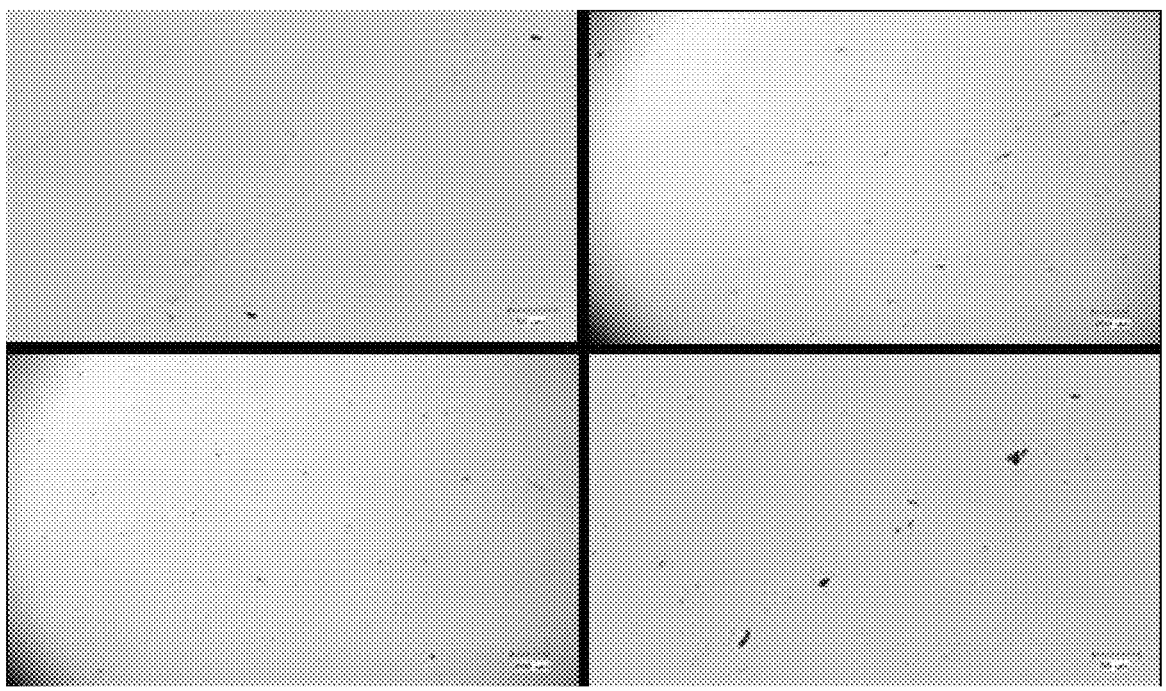
FIG. 3 is a group of optical micrographs of the surfaces of Si targets made by comparative process A. Defects including scratches, micro-cracks, indentations, pores, and chips were observed on these surfaces.
Figure 4:
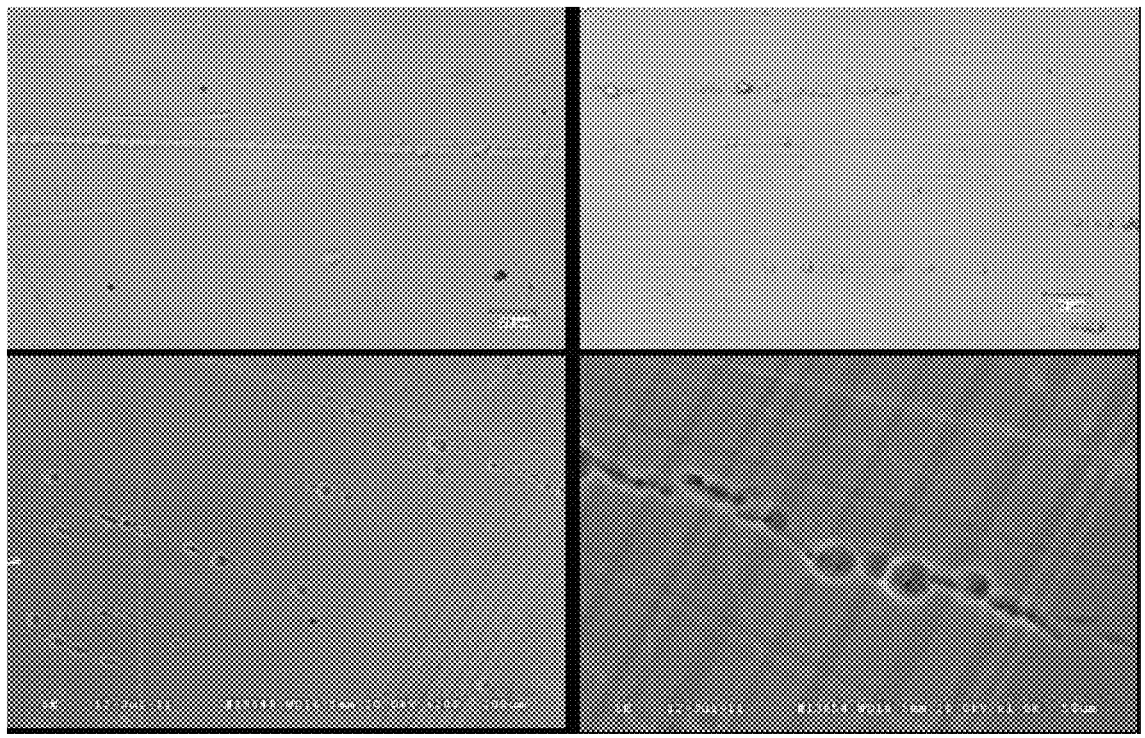
FIG. 4 is a group of SEM images of the surfaces of Si targets made by comparative process A. Defects including scratches, stains, pores, chips, and micro-cracks were observed on these surfaces.
Figure 5:
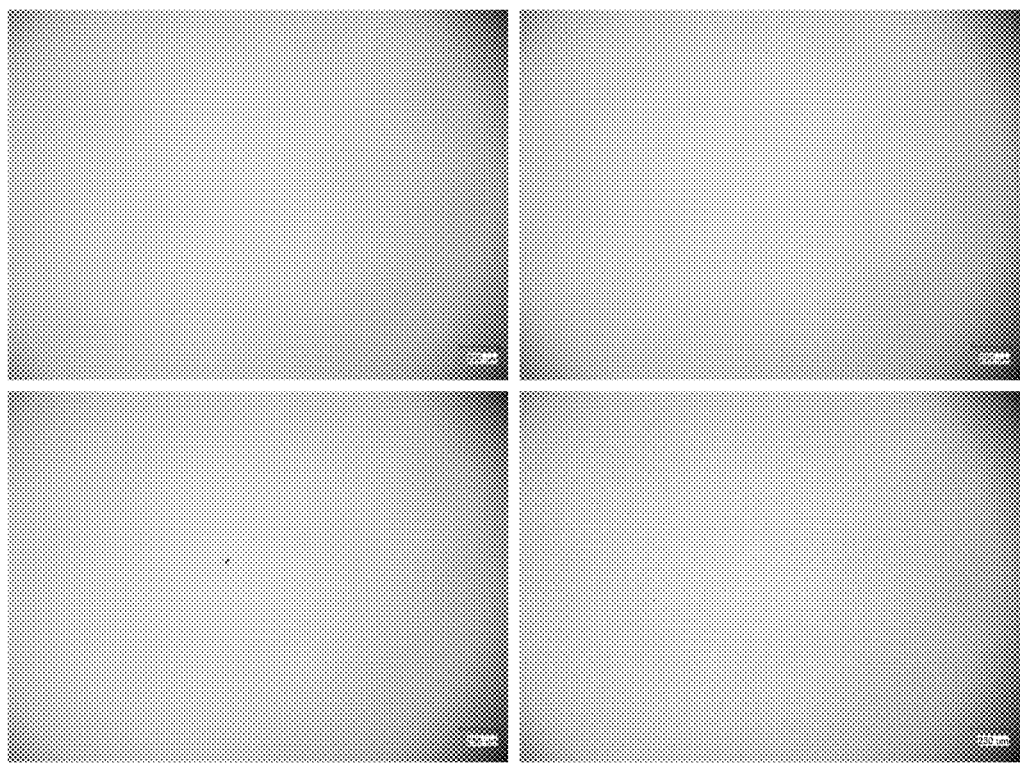
FIG. 5 is a group of optical micrographs of the surfaces of Si targets made by process B in accordance with one embodiment of the invention. These surfaces are clean and almost defect-free except for few spot defects.

Surface microstructures examinations have been performed on the silicon targets subjected to surface process A and B. As shown in FIG. 3, the optical microscopy imaging indicates Si targets subjected to comparative surface process A have a significant amount of surface defects including scratches, micro-cracks, indentations, pores, and chips. As shown in FIG. 4, scanning electron microscopy (SEM) confirms scratches, stains, pores, chips, and micro-cracks surfaces exist on the surfaces of the silicon targets subjected to process A. By the contrast, as shown in FIG. 5, the surfaces of the silicon targets subjected to process B are clean and nearly defect-free.

Figure 6:
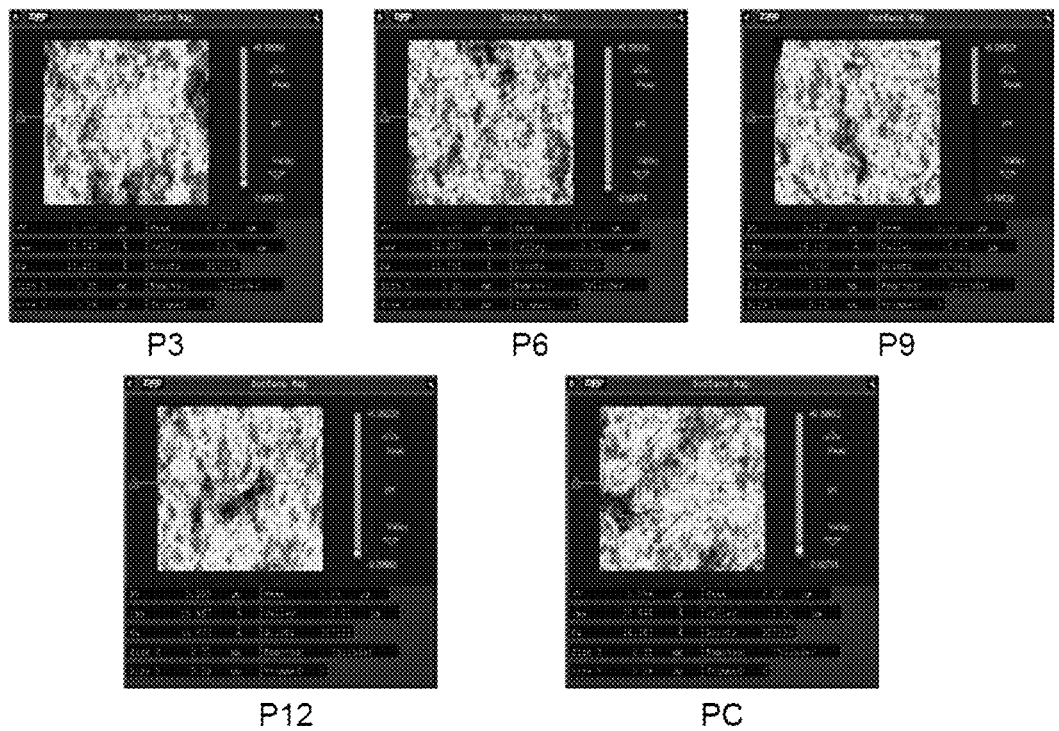
FIG. 6 is interferometer imaging and surface roughness measurement results of the Si target made by comparative surface process A. Parallel scratches were detected at target center. Interferometer roughness has been performed at five positions—target surface center (PC), 3 o'clock position (P3), 6 o'clock position (P6), 9 o'clock position (P9), and 12 o'clock position (P12) 3 inches away from target surface perimeter. The measured roughness is PC=20.848 Angstrom, P3=16.749 Angstrom, P6=14.689 Angstrom, P9=16.199 Angstrom, and P12=15.487 Angstrom. The average measured roughness is 16.794 Angstrom and a standard deviation of 2.394 Angstrom.
Figure 7:
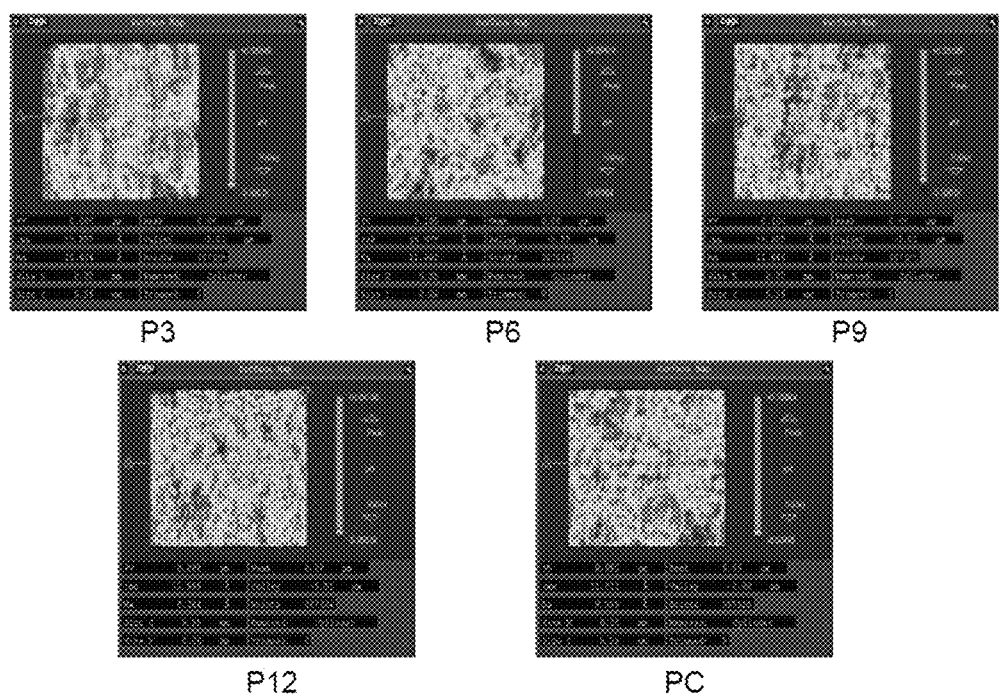
FIG. 7 is interferometer imaging and surface roughness measurement results of the Si target made by surface process B in accordance with one embodiment of the invention. No apparent defects were detected on the surfaces. The measured roughness is PC=11.911 Angstrom, P3=13.857 Angstrom, P6=15.079 Angstrom, P9=14.625 Angstrom, and P12=11.888 Angstrom. The average measured roughness is 13.472 Angstrom and a standard deviation of 1.500 Angstrom.

Non-destructive interferometer surface roughness measurements have been conducted to measure surface roughness of the silicon targets subjected to surface processes A and B. FIG. 6 is the interferometer images and roughness measurement data for the surface of a Si target subjected to process A. Roughness has been performed at 5 positions—target surface center (PC), 3 o'clock position (P3), 6 o'clock position (P6), 9 o'clock position (P9), and 12 o'clock position (P12) 3 inches away from target surface perimeter. The measurement indicated average roughness is 16.79 Angstrom with a standard deviation of 2.394 Angstrom. Parallel type scratches were detected. FIG. 7 is the interferometer images and roughness measurement data for the surface of a Si target subjected to process B. No defects were detected on the target surfaces. The measured roughness is PC=11.911 Angstrom, P3=13.857 Angstrom, P6=15.079 Angstrom, P9=14.625 Angstrom, and P12=11.888 Angstrom. The average measured roughness is 13.472 Angstrom and a standard deviation of 1.500 Angstrom. The Si target surfaces subjected to process B have fewer surface defects and lower roughness than the Si target surfaces subjected to process A.

Figure 8:
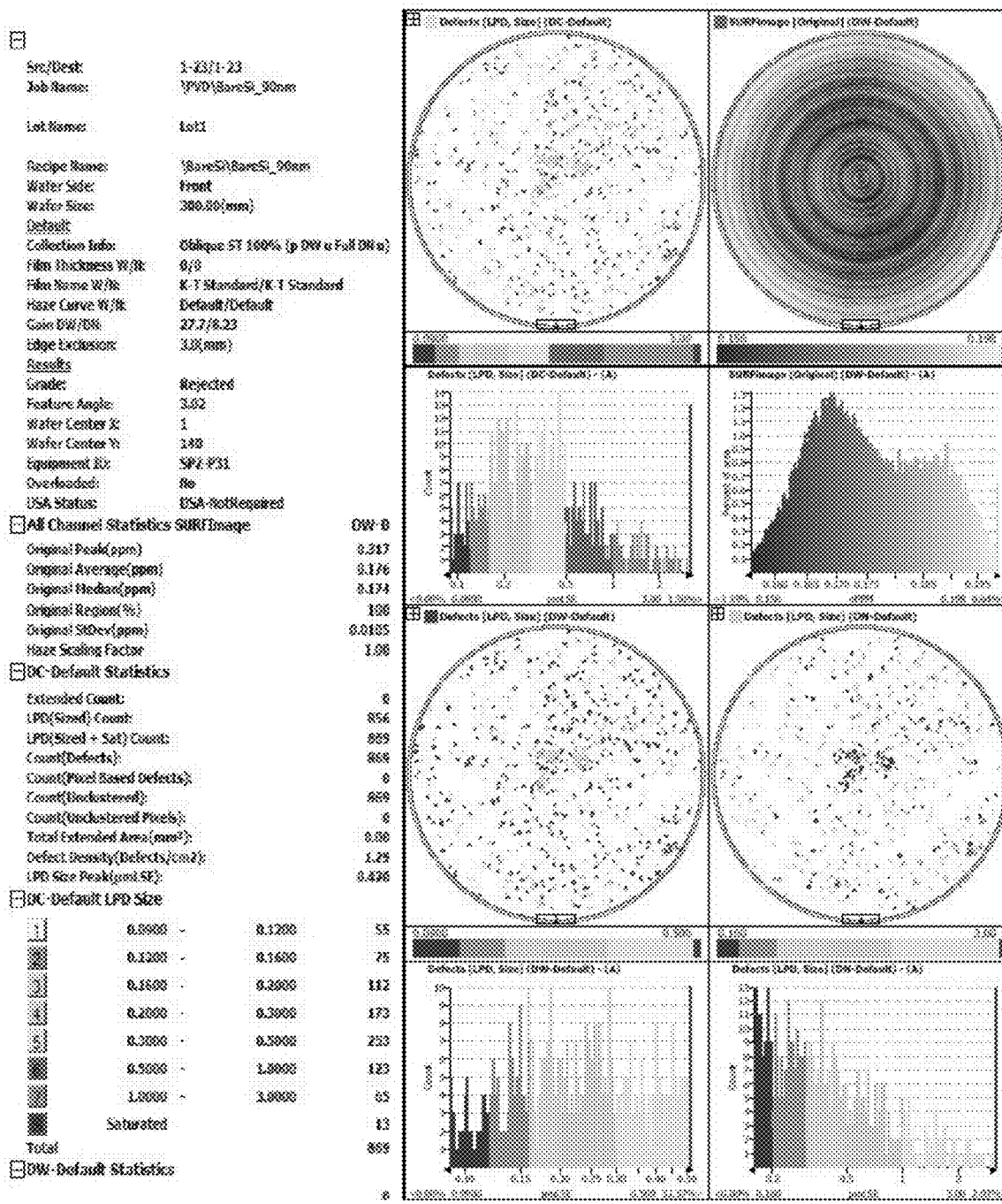
FIG. 8 is particle map and particle counts of Si films deposited from the Si target made by comparative process A. A total of 869 particles have been detected on the films after the Si target had been conditioned/burned in for more than 24 hours.
Figure 9:
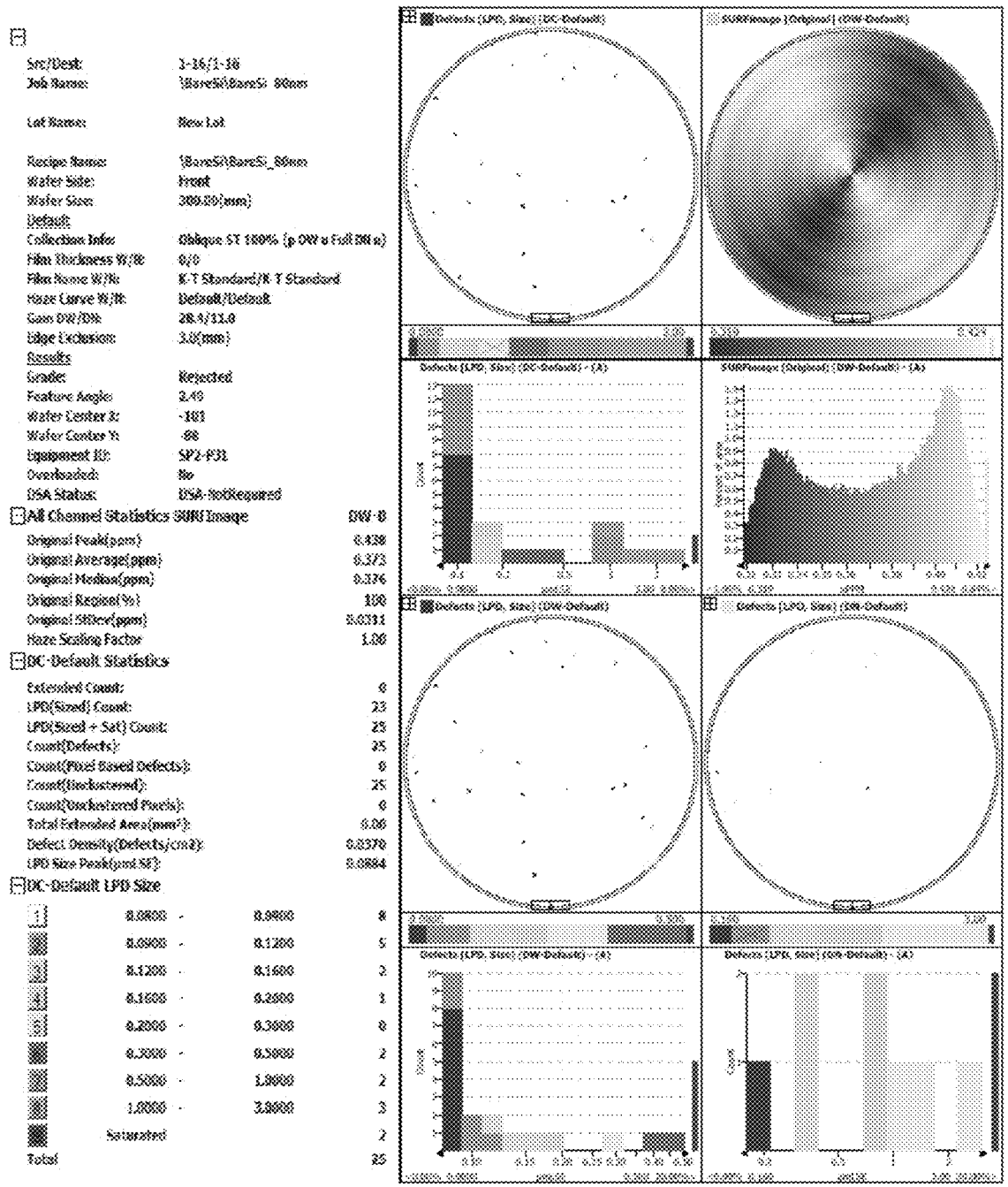
FIG. 9 is particle map and particle counts of Si films deposited from the Si target made by process B in accordance with one embodiment of the invention. Only 25 particles have been detected on the films after the Si target had been conditioned/burned in for less than 8 hours.

Sputtering tests have been performed on these two 300 mm Si targets made by the process A and B. The sputtering process parameters were identical. The target were conditioned or burned in to get achieve desirable low particle counts. For the Si target subjected to process A, the initial particle count was more than 2000 and as shown in FIG. 8, after 24 hours burning in, there were still over 800 particles detected on the films. In contrast, initial particle count was low for the films deposited from the target subjected to process B, and as shown in FIG. 9, the particle count level was brought down to 50 particles or lower under less than 8 hour burn-in. In some cases, the particle counts detected on the films deposited from the Si target subjected to process B were less than 5, this is one of the lowest particle counts has been ever achieved for the films deposited from the sputtering targets of different materials. The Si targets subjected to process B have significantly lower particle counts and shorter burn-in times than the Si targets subjected to process A.

We discovered that the Si target burn-in time and particle performance were correlated to the target surface conditions or processes. We discovered the Si targets subjected to a surface process (Process B) consisting of surface removal, i.e., scratch removal, and multiple cleaning manufacturing operations have fewer surface defects and lower surface roughness than the Si targets subjected to a surface process (Process A) without target surface damage removal and intermediate cleaning manufacturing operations. We believe process B remove Si target surface sub-layer damages and potential contaminations and thus resulting cleaner target surfaces and fewer surface defects, and fewer film particle counts and shorter burn-in times.

It is apparent then, that methods are disclosed herein for manufacturing silicon sputtering targets. In one embodiment, a silicon sputtering target is provided in conjunction with a backing plate comprising molybdenum or a molybdenum copper composite. The silicon target diameters can range from about 800 mm or less.

The silicon blank has a high surface finish to achieve good sputter performance and is made from a silicon ingot subjected to manufacturing operations, such as sawing, machining, grinding, lapping, polishing, surface damage removal (i.e., scratch removal), etching, cleaning, and inspection. In preferred embodiments, additional cleaning and etching steps are provided between any two of these operations to form a silicon target surface having desirable surface conditions. The resulting silicon targets have a visually mirror shining reflection and nearly damage/defect free surface, with a surface roughness of less than 500 Angstroms, preferably less than 100 Angstroms.

Silicon targets in accordance with the invention have a short burning time and the films deposited from the resulting Si targets have low particle counts.

The silicon target may, for instance, have a purity of at least about 99.999% excluding dopants. The silicon target blank may have a diameter up to about 500 mm and can be intrinsic p-type doped, or n-type doped. The silicon blank can have polycrystalline, single crystal, or semi-single crystal structure.

The backing plate can be pure molybdenum with a purity of 2N5 or higher, or in other embodiments, a molybdenum copper composite backing plate may be utilized. In still other aspects of the invention, a titanium aluminum composite may be used as the backing structure.

The target blank may be bonded to the backing plate through solder bonding such as by use of indium, tin-silver, and nanofoil. In other embodiments, the backing plate materials have a coefficient of thermal expansion that is chosen to closely match the coefficient of thermal expansion of the silicon target material. Such backing plate materials include, but are not limited to, No, Ti, Zr, Ta, Hf, Nb, W, Cu and alloys of these elements, especially Mo/Cu and Ti/Al composite backing plates.

The present invention has been disclosed in connection with the preferred embodiments thereof, it should be understood that the invention is not limited to the specific embodiments described since the means herein comprise preferred forms of putting the invention into effect, and other embodiments may be within the scope of the invention as defined by the following claims.

The invention claimed is:

1. A sputter target assembly, the assembly comprising a Si single crystal target having a diameter of at least about 400 mm and a backing plate bonded to said target, said Si target having a purity of at least 99.999%, said Si target comprising a surface finish having a surface roughness less than or equal to about 15.0 Angstroms, wherein said sputter target has a particle performance defect density of less than about 0.0370 defects/cm$^2$.

2. The assembly as recited in claim 1, wherein said backing plate comprises Cu or Cu alloy, Mo or a Mo/Cu composite, or Al/Ti composite.

3. The assembly as recited in claim 1, wherein said roughness is about 13.5 Angstroms with a standard deviation of about 1.5 Angstroms.

4. The assembly as recited in claim 1, wherein said Si target has an average roughness of 13.472 Angstroms and a standard deviation of 1.500 Angstroms.

5. The assembly as recited in claim 1, in combination with a Si film made by sputter coating of said target upon a substrate, said film comprising Si with a particle count of 50 or less after a target burn in of 8 hours or less.

6. The silicon target of claim 1, wherein said diameter is between about 400-500 mm.

7. A sputter target assembly, the assembly comprising a Si single crystal target having a diameter of about 400 mm and a backing plate bonded to said target, said Si target having a purity of at least 99.999%, said Si target comprising a surface finish having a surface roughness less than or equal to about 15.0 Angstroms, wherein said target is made from an ingot having a diameter between about 450-800 mm and being dislocation free, wherein said sputter target has a particle performance defect density of less than about 0.0370 defects/cm$^2$.

8. The assembly as recited in claim 7, wherein said backing plate comprises Cu or Cu alloy, Mo or a Mo/Cu composite, or Al/Ti composite.

9. The assembly as recited in claim 7, wherein said roughness is about 13.5 Angstroms with a standard deviation of about 1.5 Angstroms.

10. The assembly as recited in claim 7, wherein said Si target has an average roughness of 13.472 Angstroms and a standard deviation of 1.500 Angstroms.

11. The assembly as recited in claim 7, in combination with a Si film made by sputter coating of said target upon a substrate, said film comprising Si with a particle count of 50 or less after a target burn in of 8 hours or less.

12. The silicon target of claim 7, wherein said diameter is between about 400-500 mm.

13. A sputter target assembly, the assembly comprising a Si single crystal target having a diameter of about 400-500 mm and a backing plate bonded to said target, said Si target having a purity of at least 99.999%, said Si target comprising a surface finish having a surface roughness less than or equal to about 15.0 Angstroms, wherein said target is made from an ingot having a diameter between about 450-800 mm and being dislocation free, wherein said sputter target has a particle performance defect density of less than about 0.0370 defects/cm$^2$.

* * * * *